(12) United States Patent
Takahashi et al.

(10) Patent No.: US 8,699,228 B2
(45) Date of Patent: Apr. 15, 2014

(54) POWER MODULE

(75) Inventors: Keiko Takahashi, Osaka (JP); Masanori Minamio, Osaka (JP); Kenya Yamashita, Hyogo (JP)

(73) Assignee: Panasonic Corporation, Osaka (JP)

( * ) Notice: Subject to any disclaimer, the term of this patent is extended or adjusted under 35 U.S.C. 154(b) by 258 days.

(21) Appl. No.: 13/402,968

(22) Filed: Feb. 23, 2012

(65) Prior Publication Data

US 2012/0218717 A1  Aug. 30, 2012

(30) Foreign Application Priority Data

Feb. 24, 2011 (JP) ................................. 2011-038014
Nov. 15, 2011 (JP) ................................. 2011-249728

(51) Int. Cl.
 *H05K 7/20* (2006.01)
(52) U.S. Cl.
 USPC ........... 361/717; 361/704; 361/707; 361/709; 361/710; 361/715; 165/80.3
(58) Field of Classification Search
 None
 See application file for complete search history.

(56) References Cited

U.S. PATENT DOCUMENTS

| | | | | |
|---|---|---|---|---|
| 5,434,449 A * | 7/1995 | Himeno et al. | ................ | 257/690 |
| 5,616,957 A * | 4/1997 | Kajihara | ........................ | 257/712 |
| 6,313,520 B1 * | 11/2001 | Yoshida et al. | ................ | 257/676 |
| 6,341,066 B1 * | 1/2002 | Murowaki et al. | ............ | 361/707 |
| 6,937,462 B2 * | 8/2005 | Kamiya | ........................ | 361/752 |
| 6,940,164 B1 | 9/2005 | Yoshimatsu et al. | | |
| 7,561,429 B2 * | 7/2009 | Yahata et al. | .................. | 361/715 |
| 7,643,297 B2 * | 1/2010 | Tominaga et al. | ............ | 361/704 |
| 7,687,903 B2 * | 3/2010 | Son et al. | ....................... | 257/723 |
| 7,859,852 B2 * | 12/2010 | Wetzel et al. | ................. | 361/749 |
| 8,243,454 B2 * | 8/2012 | Oota | ................................ | 361/719 |
| 8,254,133 B2 * | 8/2012 | Imai | ................................ | 361/736 |
| 8,552,541 B2 * | 10/2013 | Lim et al. | ...................... | 257/675 |

FOREIGN PATENT DOCUMENTS

JP   4270864 B2   3/2009

* cited by examiner

*Primary Examiner* — Boris Chervinsky
(74) *Attorney, Agent, or Firm* — RatnerPrestia

(57) ABSTRACT

A reliable power module is realized, in which a good performance of radiating heat of the power semiconductor element is secured and it is hard for the heat of a power semiconductor element to be conducted to a driving element. A power module includes a power semiconductor element mounted on a lead frame, and a driving element mounted on the lead frame, and a heat radiating plate radiating heat which is generated by the power semiconductor element, and a resin holding the power semiconductor element, the driving element, and the heat radiating plate, wherein the heat radiating plate has a portion disposed at a side opposite to a surface of the lead frame where the power semiconductor element is mounted, a portion disposed between the power semiconductor element and the driving element, and a portion disposed below the power semiconductor element, as the portions being in a body.

12 Claims, 18 Drawing Sheets

POWER MODULE

FIELD OF THE INVENTION

The present invention relates to a power module equipped with a semiconductor element etc.

BACKGROUND OF THE INVENTION

Conventionally, as a power module which has a cooling structure, a configuration equipped with a power semiconductor element, a smoothing capacitor and a metal heat radiating plate radiating heat which is generated by the smoothing capacitor, is indicated (see, for example, Japanese Patent No. 4270864). Furthermore, in the conventional configuration, the metal heat radiating plate is divided into a first domain where the smoothing capacitor is disposed and a second domain where the power semiconductor element is disposed. That is, a conventional power module as shown in FIG. 19 is equipped with a power semiconductor element 1, a smoothing capacitor 21 and a heat radiating plate 5 radiating heat which is generated by the power semiconductor element 1 and the smoothing capacitor 21. And a slit 22 is formed in the heat radiating plate 5, so that the heat which is generated in a first domain 5a at the smoothing capacitor 21 side and the heat which is generated in a second domain 5b at the smoothing capacitor 21 side, are separated thermally. This separation prevents the temperature of the smoothing capacitor 21 from going up by the heat which is generated by the power semiconductor element 1.

SUMMARY OF THE INVENTION

Technical Problem

However, in the configuration of the cooling structure of the above-mentioned conventional power module, each region 5a, 5b is separated by the slit 22 formed in the metal heat radiating plate 5 in order to prevent the heat from being conducted from the first domain 5a to the second domain 5b. Therefore, the volume of the metal heat radiating plate 5 radiating the heat which is generated by the power semiconductor element 1 and the smoothing capacitor 21, decreases because of the portion where the slit 22 is formed, so that it is hard to realize a power module excellent in the performance of radiating heat of the power semiconductor element 1 and the smoothing capacitor 21. Therefore, the good performance of radiating heat is not securable.

In view of the above-mentioned problem of the conventional power module, the present invention is directed to a reliable power module in which it is hard for the heat of a power semiconductor element to be conducted to a driving element such as a smoothing capacitor while the good performance of radiating heat of the power semiconductor element is secured.

Means for Solving the Problems

The $1^{st}$ aspect of the present invention is a power module comprising:
a lead frame;
a power semiconductor element mounted on the lead frame;
a driving element mounted on the lead frame;
a heat radiating plate radiating heat which is generated by the power semiconductor element; and
a resin holding the power semiconductor element, the driving element, and the heat radiating plate, wherein
the heat radiating plate has a portion disposed at a side opposite to a surface of the lead frame where the power semiconductor element is mounted, a portion disposed between the power semiconductor element and the driving element, and a portion disposed below the power semiconductor element, as the portions being in a body.

The $2^{nd}$ aspect of the present invention is the power module according to the $1^{st}$ aspect of the present invention, wherein
the heat radiating plate has a first flat portion disposed at the side opposite to the surface of the lead frame where the power semiconductor element is mounted, a second flat portion between the power semiconductor element and the driving element, and a third flat portion disposed below the power semiconductor element.

The $3^{rd}$ aspect of the present invention is the power module according to the $2^{nd}$ aspect of the present invention, wherein
an angle that is formed by the first flat portion and the second flat portion is greater than 45 degrees and smaller than 60 degrees.

The $4^{th}$ aspect of the present invention is the power module according to the $2^{nd}$ aspect of the present invention, wherein
the third flat portion is a form of a mesh.

The $5^{th}$ aspect of the present invention is the power module according to the $2^{nd}$ aspect of the present invention, wherein
two sets of group of the lead frame, the power semiconductor element, the driving element, and the heat radiating plate are arranged;
the two sets are held with the resin; and
the two sets are laminated so that the third flat portion of each group faces each other.

The $6^{th}$ aspect of the present invention is the power module according to the $5^{th}$ aspect of the present invention, wherein
the facing two third flat portions are communalized.

The $7^{th}$ aspect of the present invention is the power module according to the $1^{st}$ aspect of the present invention, wherein
the heat radiating plate has a first flat portion disposed at the side opposite to the surface of the lead frame where the power semiconductor element is mounted, and a portion whose cross-sectional form is arc-shaped, and which passes along between the power semiconductor element and the driving element and goes below the power semiconductor element.

The $8^{th}$ aspect of the present invention is the power module according to the $7^{th}$ aspect of the present invention, wherein
two sets of group of the lead frame, the power semiconductor element, the driving element, and the heat radiating plate are arranged;
the two sets are held with the resin; and
the two sets are laminated so that the arc-shaped portion of each group faces each other.

The $9^{th}$ aspect of the present invention is the power module according to the $1^{st}$ aspect of the present invention, wherein
the heat radiating plate has a first flat portion disposed at the side opposite to the surface of the lead frame where the power semiconductor element is mounted, and a forth flat portion which passes along between the power semiconductor element and the driving element and goes below the power semiconductor element.

The $10^{th}$ aspect of the present invention is the power module according to the $9^{th}$ aspect of the present invention, wherein
an angle that is formed by the first flat portion and the forth flat portion is greater than 45 degrees and smaller than 60 degrees.

The 11th aspect of the present invention is the power module according to the 9th aspect of the present invention, wherein two sets of group of the lead frame, the power semiconductor element, the driving element, and the heat radiating plate are arranged;

the two sets are held with the resin; and the two sets are laminated so that the forth flat portion of each group faces each other.

The 12th aspect of the present invention is the power module according to the 1st aspects of the present invention, wherein an end portion, which is disposed below the power semiconductor element, of the heat radiating plate does not touch the lead frame.

Advantageous Effects of Invention

As mentioned above, according to the present invention, it is possible to provide a reliable power module in which it is hard for the heat of a power semiconductor element to be conducted to a driving element while a good performance of radiating heat of the power semiconductor element is secured.

BRIEF DESCRIPTION OF THE DRAWINGS

FIG. 18A is a view illustrating the katakana character;

FIG. 18B is a view illustrating the alphabet character "U";

FIG. 18C is a view illustrating the katakana character;

FIG. 18D is a view illustrating the alphabet character "V"; and

PREFERRED EMBODIMENTS OF THE INVENTION

Hereinafter, an embodiment in accordance with the present invention will be described with reference to the drawings.

Embodiment 1

Figure 1:
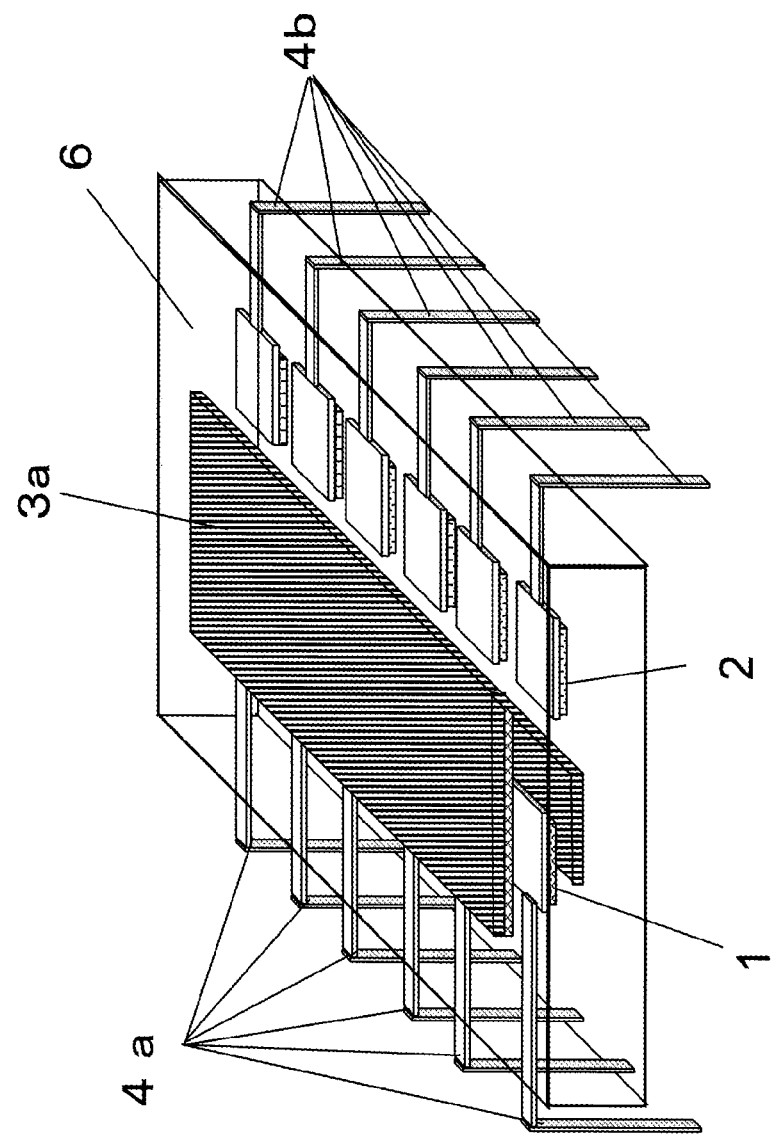
FIG. 1 is a perspective view illustrating a power module in Embodiment 1 of the present invention.
Figure 2:
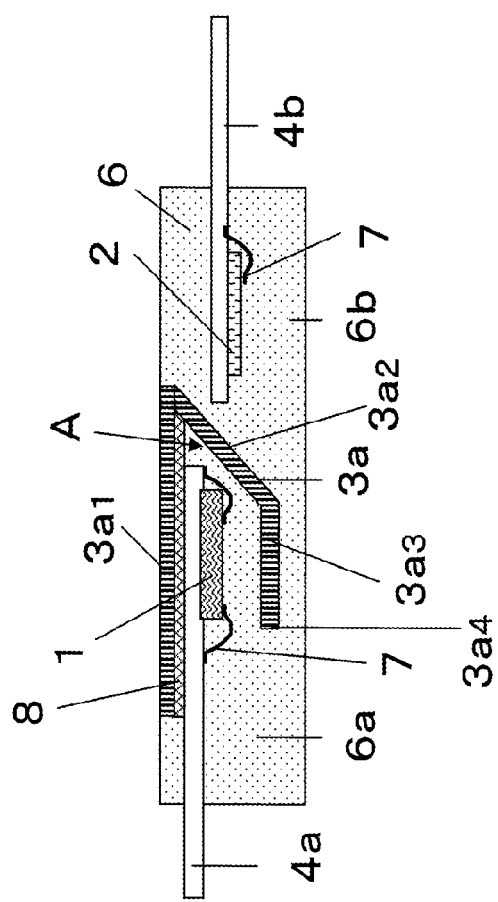
FIG. 2 is a cross-sectional schematic view illustrating a power module in Embodiment 1 of the present invention.

FIG. 1 is a perspective view illustrating a whole of a power module to Embodiment 1 of the present invention. FIG. 2 is a cross-sectional schematic view illustrating the power module to Embodiment 1 of the present invention.

A power semiconductor element 1 shown in FIG. 2 is a power semiconductor element to which a large electric current is sent, and typical examples of the power semiconductor element are IGBT, MOSFET, etc. The driving element 2 is a driving element for driving the power semiconductor element 1, for example, a smoothing capacitor. The heat radiating plate 3a is a heat radiating plate for cooling the heat which is generated by the power semiconductor element 1, and is made from metal or alloy with high thermal conductivity, such as copper. And the heat radiating plate is bent so that a cross-sectional shape is similar to the katakana character as shown in FIG. 18A and is bent so as to make a domain 6a of the power semiconductor element 1 side and a domain 6b of the driving element 2 side, being separated.

A lead frame 4a is a lead frame disposed in the power semiconductor element 1 side, and a lead frame 4b is a lead frame disposed in the driving element 2 side. The power semiconductor element 1 and the driving element 2 are mounted on the lead frames 4a, 4b, and a connection between the power semiconductor element 1 and the lead frame 4a and a connection between the driving element 2 and the lead frame 4b are made by wirebonding etc. Then the lead frames 4a, 4b, the power semiconductor element 1, the driving element 2, and the wires are molded by epoxy mold resin 6 together with the heat radiating plate 3a, and the epoxy resin 6 is hardened. The power module is produced by such a method. A sign "7" shows a wirebonding connection portion.

The heat radiating plate 3a whose shape is similar to the katakana character as shown in FIG. 18A is a heat radiating plate having two parallel plane portions 3a1, 3a3 and an inclined slope portion 3a2 which connects the plane portion 3a1 and the plane portion 3a3. One plate is pressed, so that the heat radiating plate 3a is produced. The plane portion 3a1 is an example of the first flat portion of the present invention, and the plane portion 3a3 is an example of the third flat portion of the present invention, and the slope portion 3a2 is an example of the second flat portion of the present invention.

Such a heat radiating plate 3a whose shape is similar to the katakana character as shown in FIG. 18A is a heat radiating plate bent so that the power semiconductor element 1 is wrapped therein, as shown in FIG. 1 and FIG. 2, but one side of the heat radiating plate 3*a* is not closed so that the heat radiating plate 3*a* does not electrically connect with the lead frame 4*a*. Furthermore, the insulation member 8 is disposed between the plane portion 3*a*1 of the heat radiating plate and the lead frame 4*a* so that the plane portion 3*a*1 does not connect with the lead frame 4*a*.

The above-mentioned heat radiating plate 3*a* whose shape is similar to the katakana character as shown in FIG. 18A separates thermally the first domain 6*a* of the power semiconductor element 1 side and the second domain 6*b* of the driving element 2 side. The heat radiating plate 3*a* is bent so as to be similar to a shape of the katakana character as shown in FIG. 18A, so that the heat radiation plate 3*a* can receive the heat which is generated radially by the power semiconductor element 1.

Thereby, the heat radiating plate 3*a* which is bent so as to be similar to a shape of the katakana character as shown in FIG. 18A serves as a radiating route from which the heat generated by the power semiconductor element 1 can be radiated. The heat which is generated by the power semiconductor element 1 is conducted to the heat radiating plate 3*a* which is bent so as to be similar to a shape of the katakana character as shown in FIG. 18A through the epoxy mold resin 6, so that the heat is prevented from being conducted to the driving element 2 side. Moreover, the heat radiating plate 3*a* is not disposed in the domain above the driving element 2, so that the temperature of the driving element 2 is prevented from going up through the heat radiating plate 3*a*.

Figure 3:
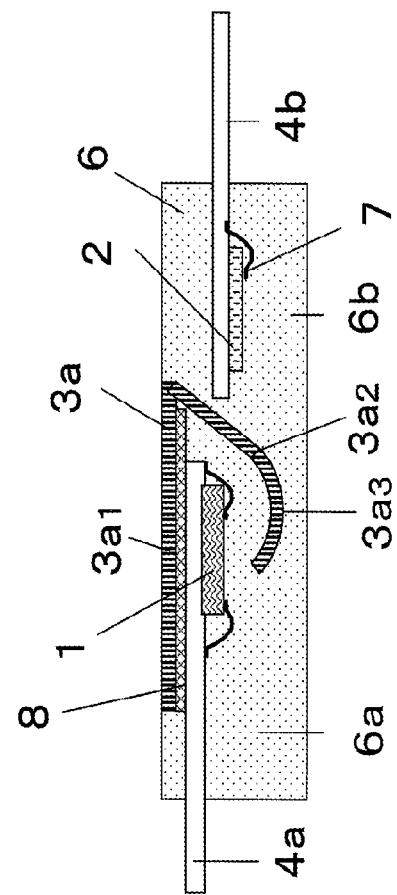
FIG. 3 is a cross sectional schematic view illustrating a modified example of a power module in Embodiment 1 of the present invention.

In addition, the form of the heat radiating plate 3*a* does not need to have the cross-sectional form which is similar to the shape of the katakana character as shown in FIG. 18A in a strict meaning. For example, a plate member whose cross-sectional form is similar to a shape of the alphabet character "U" as shown FIG. 18B can be used. Or as shown in FIG. 3, the plane portion 3*a*3 disposed in the lower part in FIG. 3 can have a curve a little.

Figure 11:
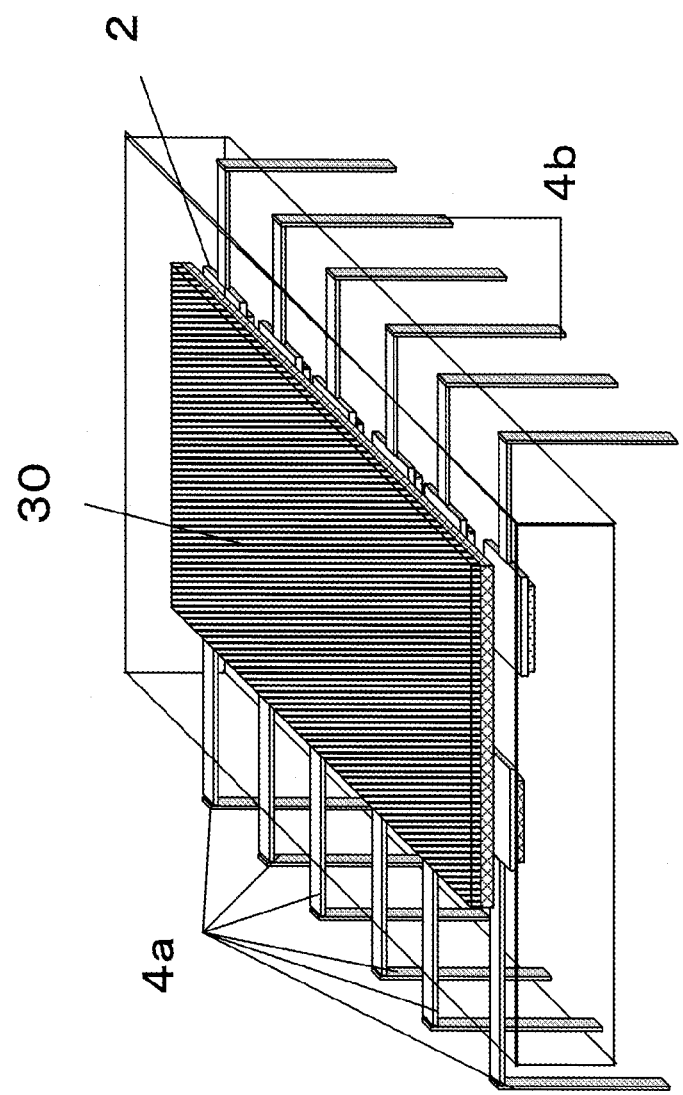
FIG. 11 is a perspective view illustrating a power module having a heat radiating plate that is flat as a comparative example.
Figure 12:
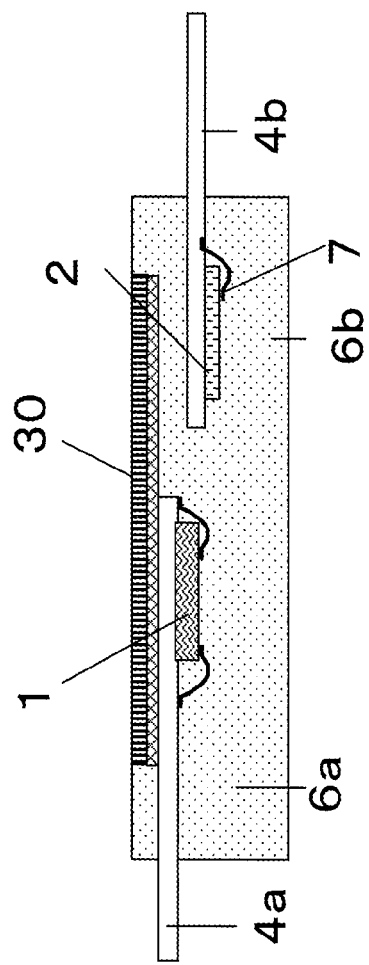
FIG. 12 is a cross-sectional schematic view illustrating a power module having a heat radiating plate that is flat as a comparative example.

FIG. 11 is a view illustrating a power module as a comparative example. The power module shown in FIG. 11 has a flat heat radiating plate 30 which covers to the upper part of the driving element 2. FIG. 12 is a cross-sectional view of FIG. 11. The radiating plate 30 shown in FIG. 11 and FIG. 12 is a heat radiating plate which is disposed only above the power semiconductor element 1 and the driving element 2. Other configurations of the power module shown in FIG. 11 and FIG. 12 are the same as the power module shown in FIG. 1 and FIG. 2.

Figure 6:
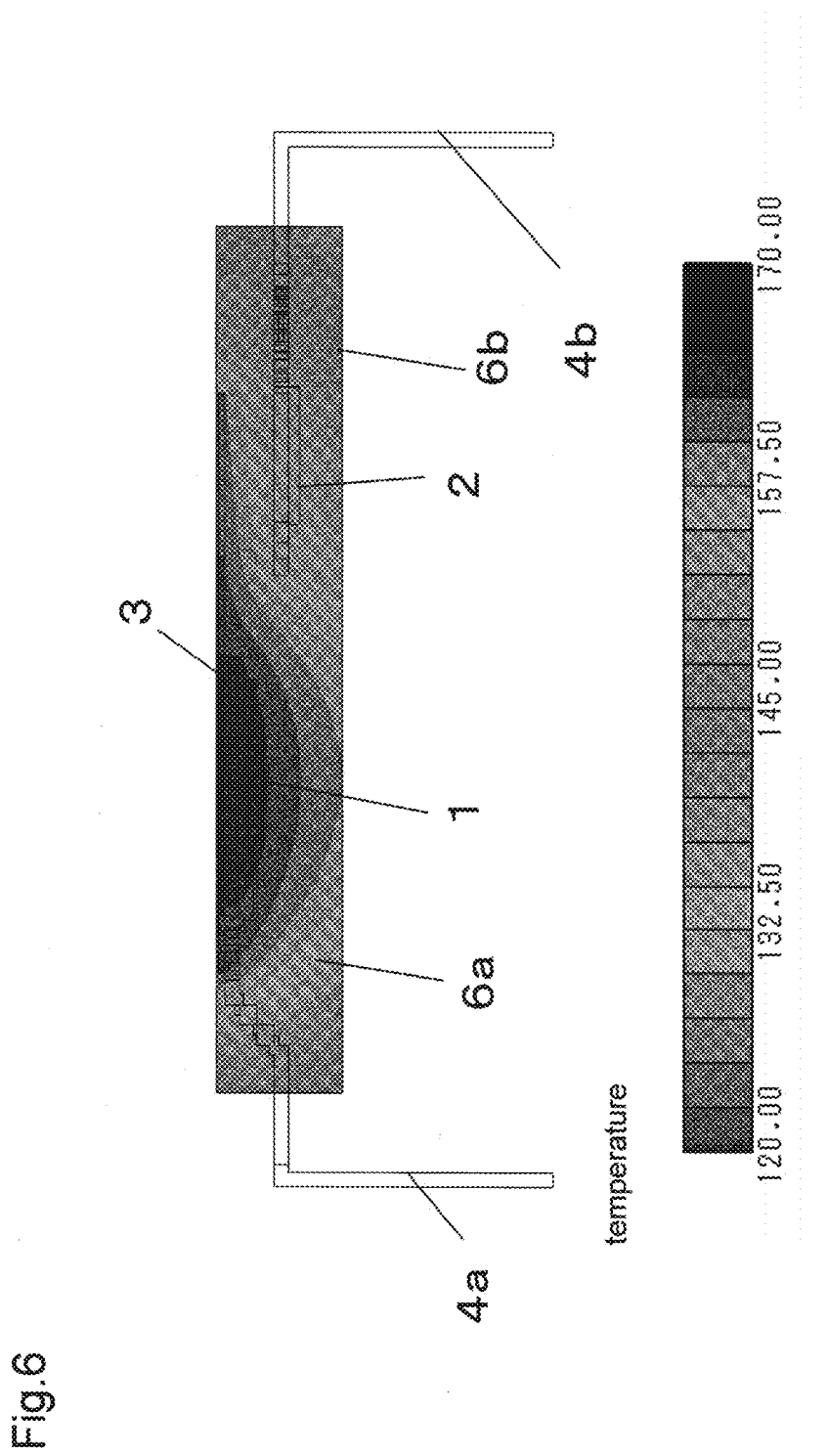
FIG. 6 is a view illustrating an analysis result of temperature distribution of a cross section of a power module, as a comparative example, having a heat radiating plate which is not bent.

FIG. 6 is, in the power module shown in FIG. 11 as a comparative example, a temperature distribution view illustrating a thermal-analysis in a steady state when each power semiconductor element 1 generates the heat by 1 W. The power module shown in FIG. 11 has the heat radiating plate 30 whose thickness is 0.1 mm, and whose initial temperature is 20° C.

Figure 7:
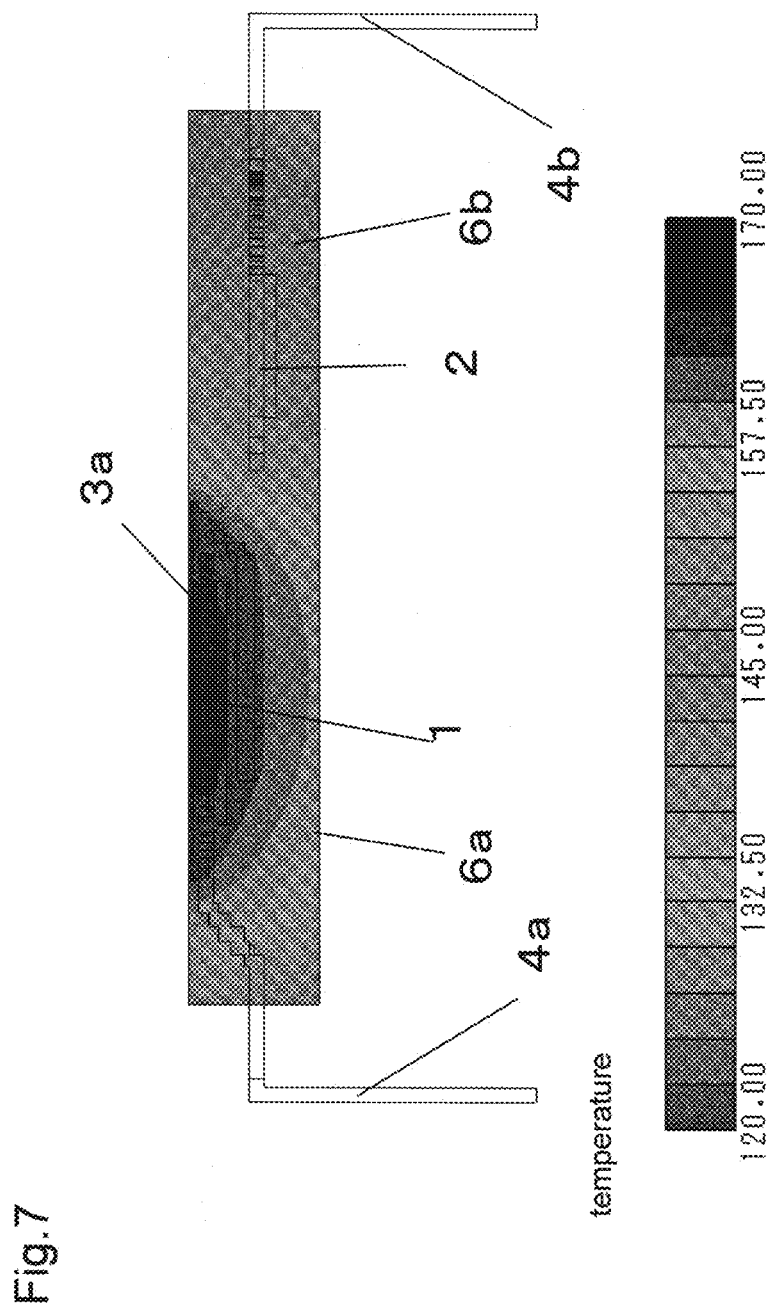
FIG. 7 is a view illustrating an analysis result of temperature distribution of a cross section of a power module in Embodiment 1 of the present invention.

FIG. 7 is, in above-mentioned Embodiment 1, a temperature distribution view illustrating a thermal-analysis in a steady state when each power semiconductor element 1 of which initial temperature is 20° C., generates the heat by 1 W. The power module shown in Embodiment 1 has the heat radiating plate 3*a*. The thickness of the plane portion 3*a*1 which is the upper portion of the heat radiating plate 3*a* is 0.1 mm, and the thickness of the slope portion 3*a*2 is 0.5 mm, and the thickness of the plane portion 3*a*3 which is the lower portion of the heat radiating plate 3*a* is 0.5 mm.

Comparison of FIG. 6 and FIG. 7 shows that it becomes hard for the heat of the power semiconductor element 1 side to be conducted to the upper position of the driving element 2, not to mention to the driving element 2, by the disposition of the heat radiating plate 3*a*, whose cross-sectional form is similar to the shape of the katakana character as shown in FIG. 18A, of Embodiment 1.

That is, the calorific quantity of the power semiconductor element 1 increases by a load change, so that the temperature of the first domain 6*a* of the power semiconductor element 1 side rises. However, as described above, the heat radiating plate 3*a*, which is bent for the cross-sectional form thereof to be the shape of the katakana character as shown FIG. 18A, serves as a radiating route, and the first domain 6*a* of the power semiconductor element 1 side and the second domain 6*b* of the driving element 2 side are separated thermally. Therefore, since the temperature rise of the second domain 6*b* is small, the temperature rise of the driving element 2 is controlled.

Since the temperature rise of the driving element 2 can be controlled regardless of the load situation of the power module in this way, the driving element 2 can be controlled within the heat-resistant temperature thereof, and the problem of a connection reliability falling of a wirebonding connection portion 7 which is generated when the temperature of the driving element 2 is high, is solved. As the result, it is not necessary to enlarge module size too much in order to radiate the heat which is generated by the power module, and the power module can be miniaturized.

As a desirable embodiment of the present invention, the heat radiating plate 3*a*, which is bent for the cross-sectional form thereof to be similar to the shape of the katakana character as shown in FIG. 18A, is bent desirably to pass through between the domain 6*a* of the power element 1 side and the domain 6*b* of the driving element 2 side in the angle range being about 45 to 60 degrees (reference to sign A in FIG. 2). Moreover, if the plane portion 3*a*1, which is disposed at the upper part of the power semiconductor element 1, of the heat radiating plate 3*a* is too small, an effect is not displayed. Moreover, since an effect can not be displayed when the slope portion 3*a*2, which passes through between the power semiconductor element 1 and the driving element 2, of the heat radiating plate 3*a* is close to the driving element 2 side, it is preferable for the slope portion 3*a*2 to be disposed at the position as close as possible to the power semiconductor element 1 side. However, the slope portion 3*a*2 needs to be disposed at the position kept an enough fixed distance from the lead frame 4*a* so that the slope portion 3*a*2 does not electrically connect with the lead frame 4*a* on which the power semiconductor element 1 is mounted.

When the bent angle is smaller than 45 degrees, the interval of the heat radiating plate 3*a* and the power semiconductor element 1 get too close, and the distance becomes heterogeneous. Therefore, it is impossible for the heat to get away efficiently.

On the other hand, when the bent angle is larger than 60 degrees, the heat radiating plate 3*a* can not cover the semiconductor element 1 or the size of the power module grows big.

In addition, it is desirable that the terminal portion 3*a*4 (reference to FIG. 2) of the heat radiating plate 3*a*, which is bent for the cross-sectional form thereof to be similar to the shape of the katakana character as shown in FIG. 18A, covers to the end portion of the power semiconductor element 1.

The power module of the present Embodiment 1 and the power module for comparison of FIG. 11 and FIG. 12 are the same configuration, such as an overall size of the power module, internal part elements, and thickness of the heat radiating plate, except the form of the heat radiating plate. As a result of comparing the power module of the present Embodiment 1 with the power module for comparison, the highest temperature of the power semiconductor element 1 can be lower than that of the power module for comparison of FIG. 11 and FIG. 12 by about 0.8° C., and the highest temperature of the driving element 2 can be lower than that of the power module for comparison of FIG. 11 and FIG. 12 by about 3.3° C.

Embodiment 2

Figure 4:
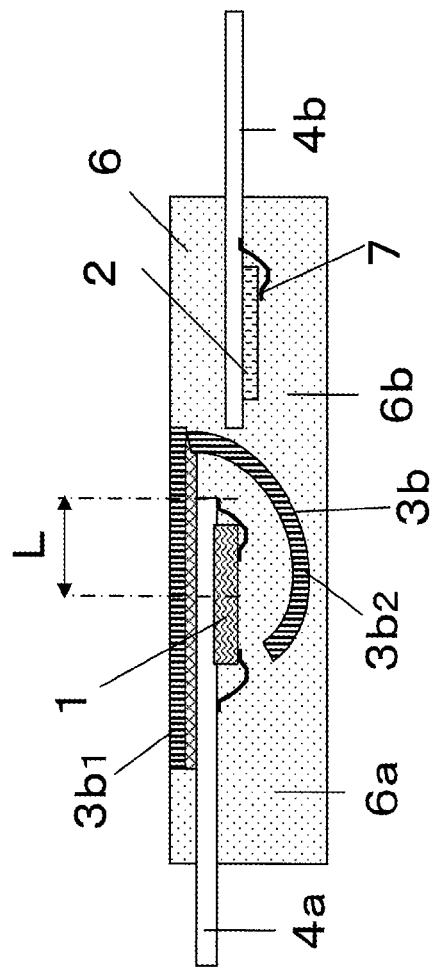
FIG. 4 is a cross-sectional schematic view illustrating a power module in Embodiment 2 of the present invention.

FIG. 4 is a cross-sectional schematic view illustrating a power module to Embodiment 2 of the present invention. The heat radiating plate 3*b* is a heat radiating plate whose cross sectional form is similar to a shape of the katakana character as shown in FIG. 18C. After one plate is bent to pass along between the domain 6*a* of the power semiconductor element 1 side and the domain 6*b* of the driving element 2 side like Embodiment 1, the bent board is processed by press processing etc. so as to draw an arc whose center is shifted to right side a little from the center of the power semiconductor 1 and whose radius is such distance L between the center of the power semiconductor 1 and the end of the lead frame 4*a*. The heat radiating plate 3*b* is produced by such a method.

The heat radiating plate 3*b* whose cross-sectional shape is similar to the katakana character as shown in FIG. 18C is a heat radiating plate having a straight plane portion 3*b*1 and a surface portion 3*b*2 with curve. One plate is pressed, so that the heat radiating plate 3*b* is produced. The heat radiating plate 3*b* whose cross-sectional shape is similar to the katakana character as shown in FIG. 18C is disposed so that the power semiconductor element 1 is wrapped therein and is molded by epoxy mold resin 6 together with the lead frame 4*a*, 4*b* on which the power semiconductor element 1 and the driving element 2 are mounted, and the epoxy mold resin 6 is hardened. The plane portion 3*b*1 is an example of the first flat portion of the present invention, and the surface portion 3*b*2 with the curve is an example of the portion whose cross-sectional form is arc-shaped of the present invention.

The first domain 6*a* of the power semiconductor element 1 side and the second domain 6*b* of the driving element 2 side are separated thermally by such a configuration. The heat radiating plate 3*b* whose cross-sectional shape is similar to the katakana character as shown in FIG. 18C receives the heat generated radially by the power semiconductor element 1, by the curve which is formed so that the power semiconductor element 1 is wrapped therein. Thereby, the heat radiating plate 3*b* whose cross-sectional shape is similar to the KATAKANA "FU" serves as a radiating route from which the heat generated by the power semiconductor 1 can be radiated.

That is, the heat which is generated by the power semiconductor element 1 is conducted to the heat radiating plate 3*b* whose cross-sectional shape is similar to the katakana character as shown in FIG. 18C through the epoxy mold resin 6, so that the heat is prevented from being conducted to the driving element 2 side.

Figure 8:
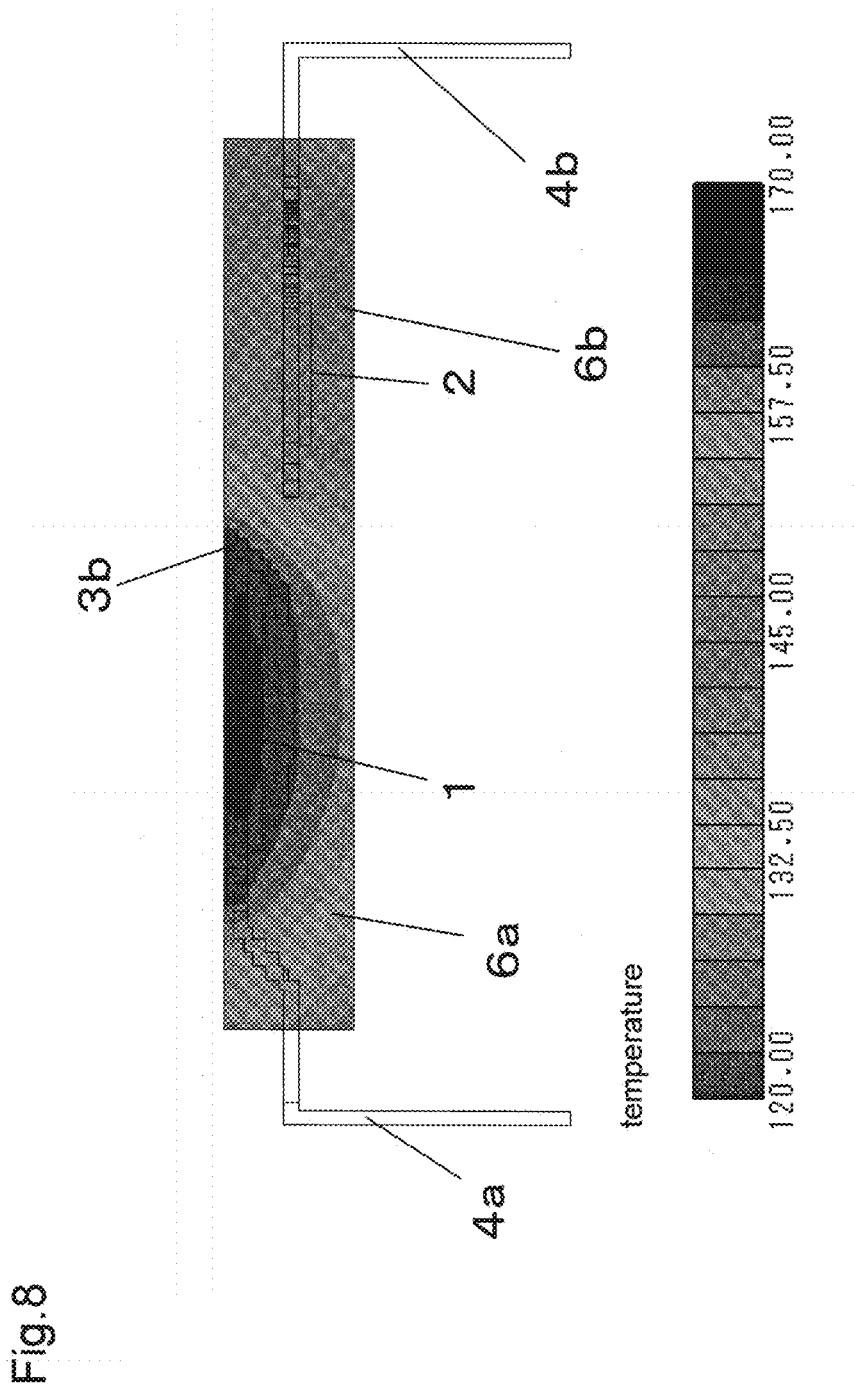
FIG. 8 is a view illustrating an analysis result of temperature distribution of a cross section of a power module in Embodiment 2 of the present invention.

FIG. 8 is, in above-mentioned Embodiment 2, a temperature distribution view illustrating a thermal-analysis in a steady state when each power semiconductor element 2 of which initial temperature is 20° C. generates the heat by 1 W. The power module shown in Embodiment 2 has the heat radiating plate 3*b*. The thickness of the plane portion 3*b*1 which is the upper portion of the heat radiating plate 3*b* is 0.1 mm, and the thickness of the surface portion 3*b*2 with the curve is 0.5 mm.

Comparison of FIG. 6 of the above-mentioned comparative example and FIG. 8 of the present Embodiment 2 shows that it becomes hard for the heat to be conducted to the upper position of the driving element 2, not to mention to the driving element 2, by the disposition of the heat radiating plate 3*b*, whose cross-sectional form is similar to the shape of the katakana character as shown in FIG. 18C, of Embodiment 2.

Therefore, the temperature of the driving element 2 can be prevented from going up highly while a cooling characteristic of the power semiconductor element 1 is secured, and the problem of a connection reliability falling of a wirebonding connection portion 7 which is generated when the temperature of the driving element 2 is high, is solved. As the result, it is not necessary to enlarge module size too much in order to radiate the heat which is generated by the power module, and the power module can be miniaturized.

The power module of the present Embodiment 2 and the power module for comparison of FIG. 11 and FIG. 12 are the same configuration, such as an overall size of the power module, internal part elements, and thickness of the heat radiating plate, except the form of the heat radiating plate. As a result of comparing the power module of the present Embodiment 2 with the power module for comparison, the highest temperature of the power semiconductor element 1 can be lower than that of the power module for comparison of FIG. 11 and FIG. 12 by about 0.9° C., and the highest temperature of the driving element 2 can be lower than that of the power module for comparison of FIG. 11 and FIG. 12 by about 3.6° C.

Embodiment 3

Figure 5:
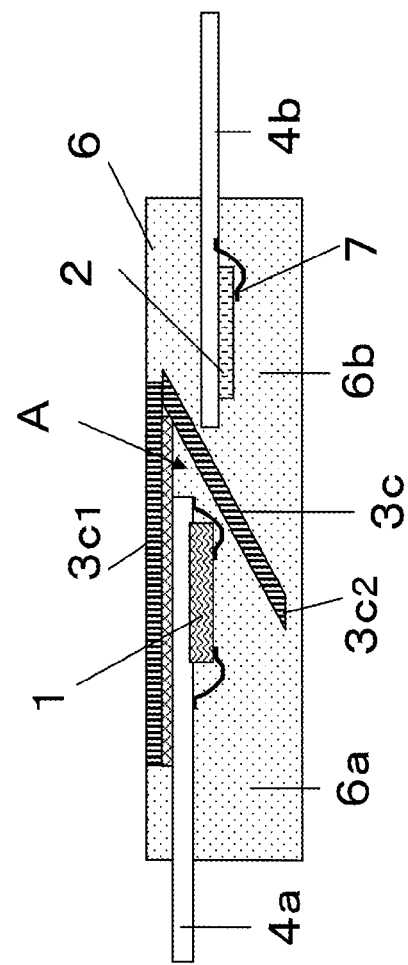
FIG. 5 is a cross-sectional schematic view illustrating a power module in Embodiment 3 of the present invention.

FIG. 5 is a cross-sectional schematic view illustrating a power module to Embodiment 3 of the present invention. The heat radiating plate 3*c* is a heat radiating plate whose cross-sectional form is similar to the shape of the alphabet character "V" as shown in FIG. 18D. The heat radiating plate 3*c* is bent so that the heat radiating plate 3*c* passes through between the power semiconductor element 1 side and the driving element 2 side as inclining to the power semiconductor element 1 side. A sign "3*c*1" shows a plane portion in upside, and A sign "3*c*2" shows a slope surface portion. The plane portion 3*c*1 is an example of the first flat portion of the present invention, and the slope surface portion is an example of the fourth flat portion of the present invention.

The heat radiating plate 3*c* whose cross-sectional shape is similar to the alphabet character "V" is disposed so that the power semiconductor element 1 is wrapped therein, and the heat radiating plate 3*c* is molded by epoxy mold resin 6 together with the lead frame 4*a*, 4*b* on which the power semiconductor element 1 and the driving element 2 are mounted, and the epoxy mold resin 6 is hardened. The power module is produced by such a method.

Figure 9:
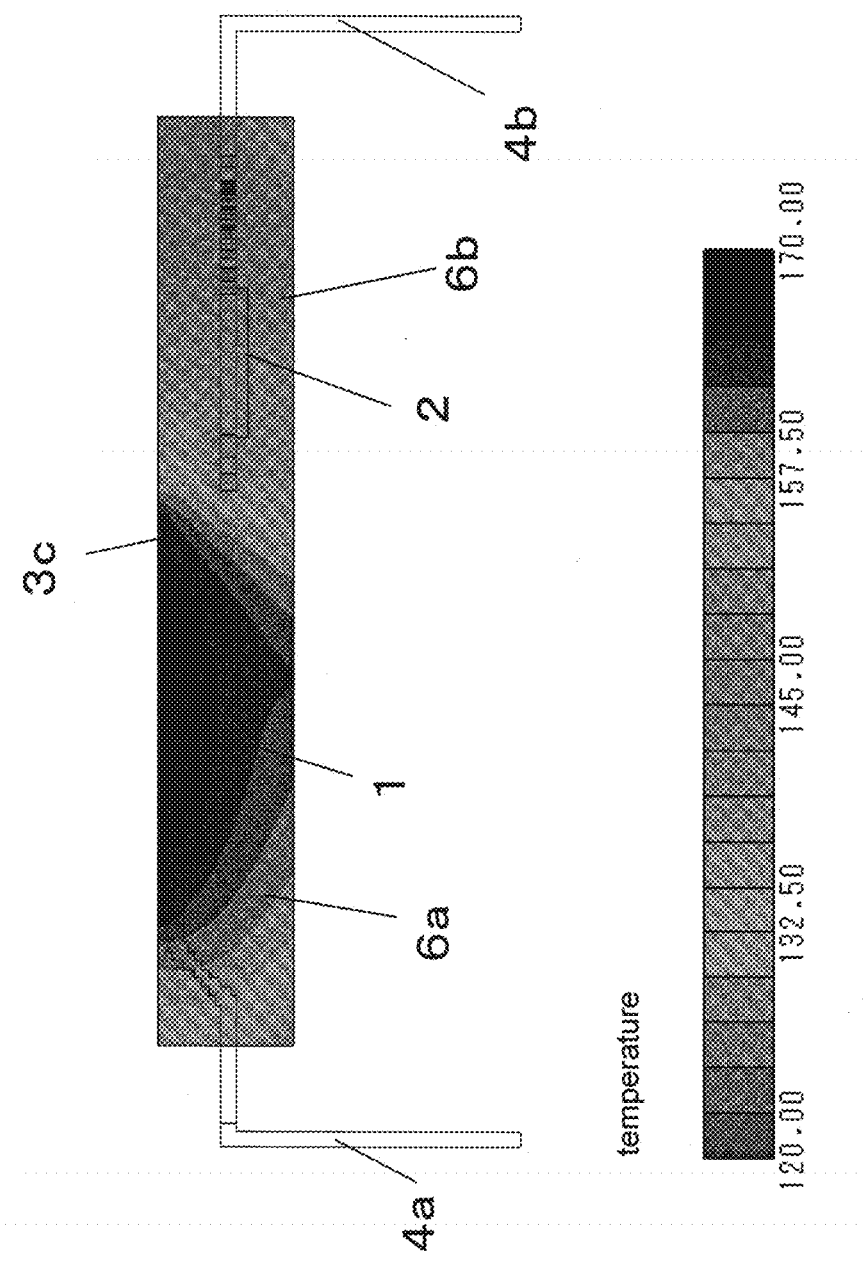
FIG. 9 is a view illustrating an analysis result of temperature distribution of a cross section of a power module in Embodiment 3 of the present invention.

FIG. 9 is, in above-mentioned Embodiment 3, a temperature distribution view illustrating a thermal-analysis in a steady state when each power semiconductor element 1 whose initial temperature is 20° C. generates the heat by 1 W. The power module shown in Embodiment 3 has the heat radiating plate 3*c*. The thickness of the plane portion 3*c*1 which is the upper portion of the heat radiating plate 3*c* is 0.1 mm, and the thickness of the slope portion 3*c*2 is 0.5 mm.

Comparison of FIG. 6 of the above-mentioned comparative example and FIG. 9 of the present Embodiment 3 shows that it becomes hard for the heat to be conducted to the upper position of the driving element 2, not to mention to the driving element 2, by the disposition of the bent heat radiating plate 3*c* of Embodiment 3.

The above-mentioned heat radiating plate 3*c* whose shape is similar to the alphabet character "V" separates thermally the first domain 6a of the power semiconductor element 1 side and the second domain 6b of the driving element 2 side. The heat radiating plate 3c is bent to be disposed along the power semiconductor element 1, so that the heat radiation plate 3a can receive the heat which is generated radially by the power semiconductor element 1.

In other word, the heat which is generated by the power semiconductor element 1 is conducted to the bent heat radiating plate 3c through the epoxy mold resin 6, so that the heat is prevented from being conducted to the driving element 2 side. Therefore, the temperature of the driving element 2 can be prevented from going up highly while a cooling characteristic of the power semiconductor element 1 is secured, and the problem of a connection reliability falling of a wirebonding connection portion 7 which is generated when the temperature of the driving element 2 is high, is solved. As the result, it is not necessary to enlarge module size too much in order to radiate the heat which is generated by the power module, and the power module can be miniaturized.

As a desirable embodiment of the present invention, the heat radiating plate 3a is bent desirably to pass through between the domain 6a of the power element 1 side and the domain 6b of the driving element 2 side in the angle range being about 45 degrees to 60 degrees (reference to sign A in FIG. 5), and to be as close as possible to the power semiconductor element 1.

Moreover, if the plane portion 3c1, which is disposed at the upper part of the power semiconductor element 1, of the heat radiating plate 3c is too small, an effect is not displayed. Moreover, since an effect can not be displayed when the slope portion 3c2, which passes through between the power semiconductor element 1 and the driving element 2, of the heat radiating plate 3a, is close to the driving element 2 side, it is preferable for the slope portion 3c2 to be disposed at a close position as possible to the power semiconductor element 1 side. However, the slope portion 3c2 needs to be disposed at the position kept an enough fixed distance from the lead frame 4a so that the slope portion 3c2 does not electrically connect with the lead frame 4a on which the power semiconductor element 1 is mounted.

When the bent angle is smaller than 45 degrees, the interval of the heat radiating plate 3c and the power semiconductor element 1 get too close, and the distance becomes heterogeneous. Therefore, it is not impossible for the heat to get away efficiently.

On the other hand, when the bent angle is larger than 60 degrees, the heat radiating plate 3a can not cover the semiconductor element 1 or the size of the power module grows big.

The power module of the present Embodiment 3 and the power module for comparison of FIG. 11 and FIG. 12 are the same configuration, such as an overall size of the power module, internal part elements, and thickness of the heat radiating plate, except the form of the heat radiating plate. As a result of comparing the power module of the present Embodiment 3 with the power module for comparison, the highest temperature of the power semiconductor element 1 can be higher than that of the power module for comparison of FIG. 11 and FIG. 12 by about 2.5° C., and the highest temperature of the driving element 2 can be lower than that of the power module for comparison of FIG. 11 and FIG. 12 by about 2.6° C.

The above mentioned result of comparison about Embodiments 1 to 3 with the comparative example, is the result about the temperature change of the power semiconductor element 1 and the driving element 2 when the power semiconductor element 1 generates the heat by 1 W.

However, under actual use, as conditions for use of the power module, since the heat-resistant temperature of a chip is 150° C., the power semiconductor is used by an input being regulated so that the temperature of the power semiconductor element 1 does not become 150° C. and over.

The temperature of the driving element 2 in time of the power semiconductor element 1 being 150° C. is calculated based on each temperature result, and when the temperature of the power semiconductor element 1 is 150° C., the temperature of the driving element 2 reaches 138.13° C. in the comparative example of FIG. 11 and FIG. 12, and 135.79° C. in Embodiment 1 of FIG. 2, and 135.65° C. in Embodiment 2 of FIG. 4, and 133.89° C. in Embodiment 3 of FIG. 5.

Figure 10:
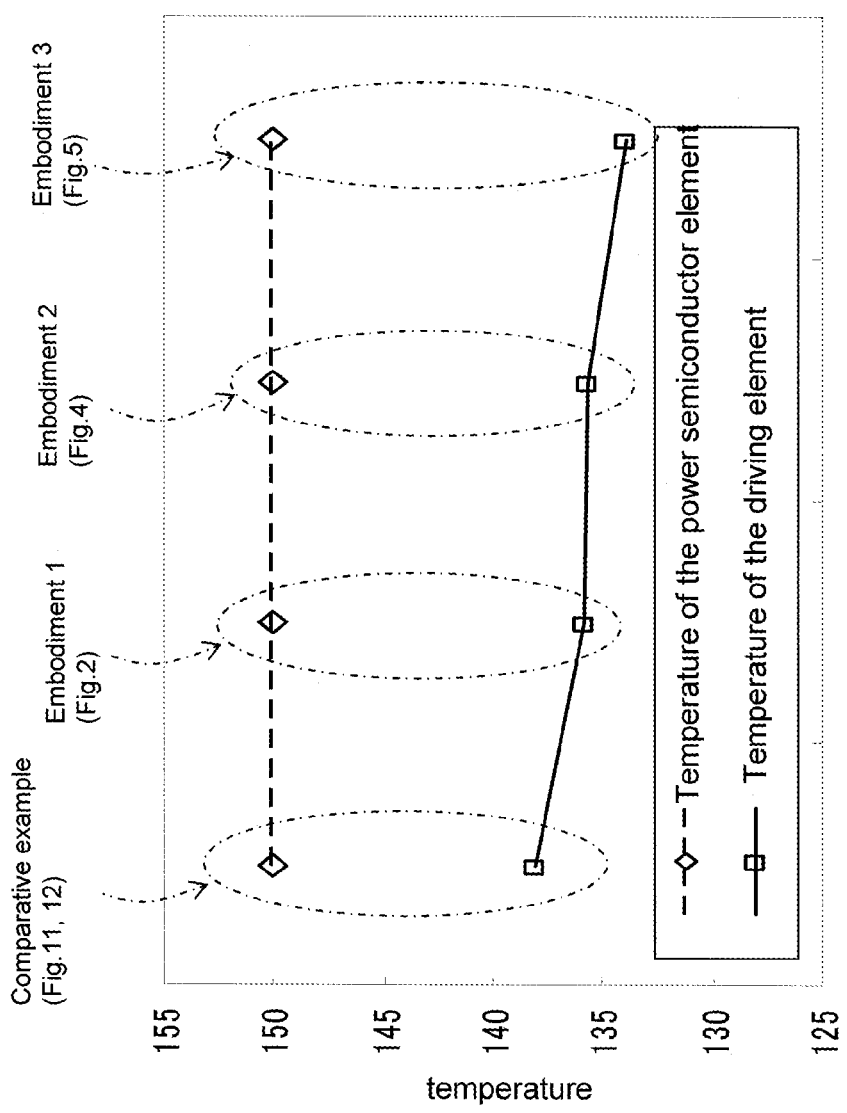
FIG. 10 is a graph illustrating comparison between an analysis result of temperature of Embodiments 1 to 3 of the present invention and an analysis result of temperature of a power module in which a bent heat radiating plate is not disposed as a comparative example.

FIG. 10 shows the graph illustrating a comparison when the temperature of the power semiconductor device 1 is 150° C. That is, FIG. 10 shows the comparative result of temperature analysis between the power module (a comparative example shown in FIG. 11, and FIG. 12), which has the heat radiating plate 30 covering the upper part of the driving element 2, and the power module of each Embodiment 1 to 3.

FIG. 10 shows clearly that Embodiment 3 of FIG. 5 is the configuration generating the most difference in temperature between the power semiconductor element 1 and the driving element 2 and is the most effective configuration to prevent a temperature rise of the driving element 2. The reason for which Embodiment 3 of FIG. 5 generates the most difference in temperature between the power semiconductor element 1 and the driving element 2 is as follows. Since the distance between the heat radiating plate 3c and the power semiconductor element 1 in Embodiment 3 is longer than the distance between the heat radiating plate 3b, 3a and the power semiconductor element 1 in Embodiment 1, 2, there is little quantity of the heat conducted to a heat radiating plate 3c from the power semiconductor element 1 in Embodiment 3. Therefore, it is thought that the temperature of the power semiconductor element 1 rises than that of Embodiment 1 and Embodiment 2, and the difference between the temperature of the power semiconductor element 1 and the temperature of the driving element 2 is relatively generated.

Embodiment 3 is the best to generate a difference in temperature between the power semiconductor element 1 and the driving element 2, and Embodiment 1, 2 are better to lower the temperature of both the power semiconductor element 1 and the driving element 2.

In addition, the reason why Embodiment 2 has a bigger difference in temperature between the power semiconductor element 1 and the driving element 2 than Embodiment 1, can be guessed as follows. Since the portion, which passes through between the power semiconductor element 1 and the driving element 2, of the heat radiating plate 3b of Embodiment 2 curves, the heat radiating plate 3b is farther from the driving element 2 than the bent heat radiating plate 3a of Embodiment 1. Therefore, in Embodiment 2, it is hard for the heat of the power semiconductor element 1 to be conducted to the driving element 2.

As explained above, since a metal heat radiating plate is bent so as to separate the domain with which the power semiconductor element is equipped and the domain with which the driving element is equipped, the upper surface or the lower surface of the power semiconductor element is covered with the heat radiating plate, and the heat of the power semiconductor element is efficiently conducted to the metal heat radiating plate without making volume of the heat radiating plat small, and the power semiconductor element is cooled.

According to the present configuration, it is hard for the heat of the power semiconductor element to be conducted to the driving element, and the temperature of the driving element is prevented from going up highly. This configuration prevents malfunction caused by the heat of the driving element, and the junction reliability of the driving element can be improved.

Embodiment 4

Figure 13:
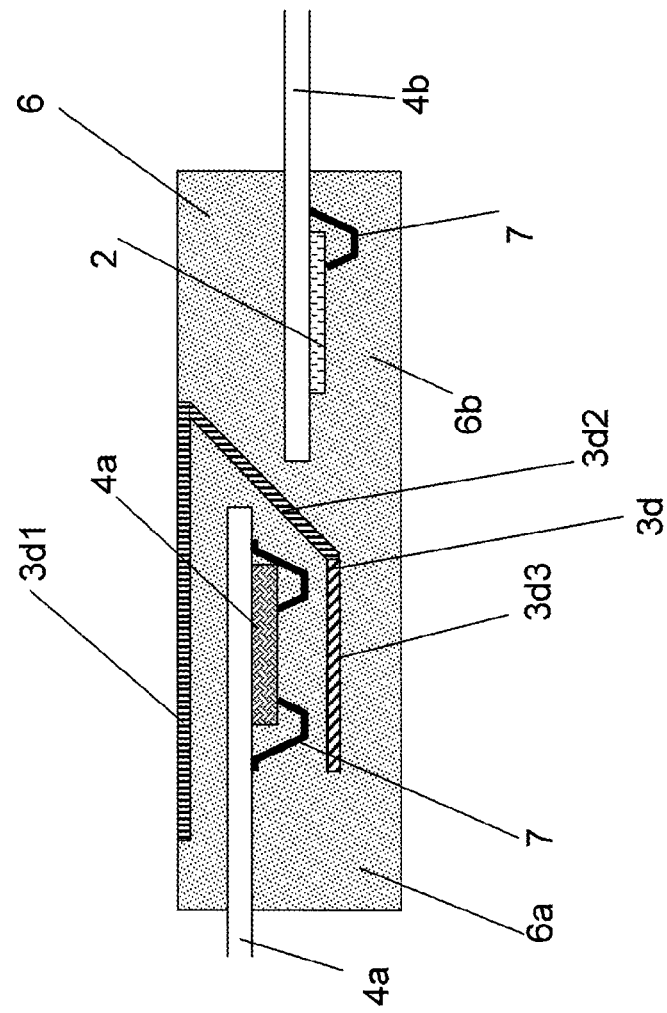
FIG. 13 is a cross-sectional schematic view illustrating a power module in Embodiment 4 of the present invention.

FIG. 13 is a cross-sectional schematic view illustrating a power module to Embodiment 4 of the present invention. The power module of Embodiment 4 is different from the power module of Embodiment 1 in a point of the configuration of the heat radiating plate, a point that the electric insulation is not disposed, and a point that electric insulation between the plane portion 3a1 and the lead frame 4a is kept by mold resin 6. Other configurations are equivalent to Embodiment 1.

The heat radiating plate 3d of Embodiment 4 is different from the heat radiating plate 3a in the point that the plane portion 3d3 is a form of mesh. The plane portion 3d3 is a form of mesh, so that the noise can be reduced. As compared with the configuration that the plane portion 3a3 is a metal plate, in Embodiment 4, residual stress decreases, and a performance of adhesion with the mold resin 6 can be improved, and the mold resin 6 flows through a mesh and fills, so that the fluidity prevention in the case of molding by the mold resin 6 is reduced. The fineness of meshes is not restricted in particular, but there need to be a plurality of openings which penetrates the plane portion 3d3. In addition, furthermore, a form of mesh can be adopted in the plane portion 3d1 and the slope portion 3d2 of other portions of the heat radiating plate 3d.

The method of producing the power module of Embodiment 4 will be described as follows. Previously, the plane portion 3d3 is formed in the shape of mesh, and the plane portion 3d3 is welded to a metal plate for the plane portion 3d1 and the plane portion 3d2, so that one metal plate is formed. Then, the one metal plate is bent in each part, so that the radiating plate 3d is produced. Then, the bent heat radiating plate 3d is molded by epoxy mold resin 6 together with the lead frame 4a, 4b on which the power semiconductor element 1 and the driving element 2 are mounted, and the epoxy mold resin is hardened. The mesh is formed by punching the metal plate. The one metal plate is made from copper or Al.

In addition, a form of mesh can be adopted in the plane portion 3a3 of the heat radiating plate 3a shown in FIG. 3, the surface portion 3b2 of the heat radiating plate 3b, and the slope portion 3c2 of the heat radiating plate 3c in Embodiment 3. Furthermore, a form of mesh can be adopted in the plane portion 3a1 and the slope portion 3a2 of the heat radiating plate 3a shown in FIG. 3, the plane portion 3b1 of the heat radiating plate 3b in Embodiment 2, and the plane portion 3c1 of the heat radiating plate 3c in Embodiment 3.

Embodiment 5

Figure 14:
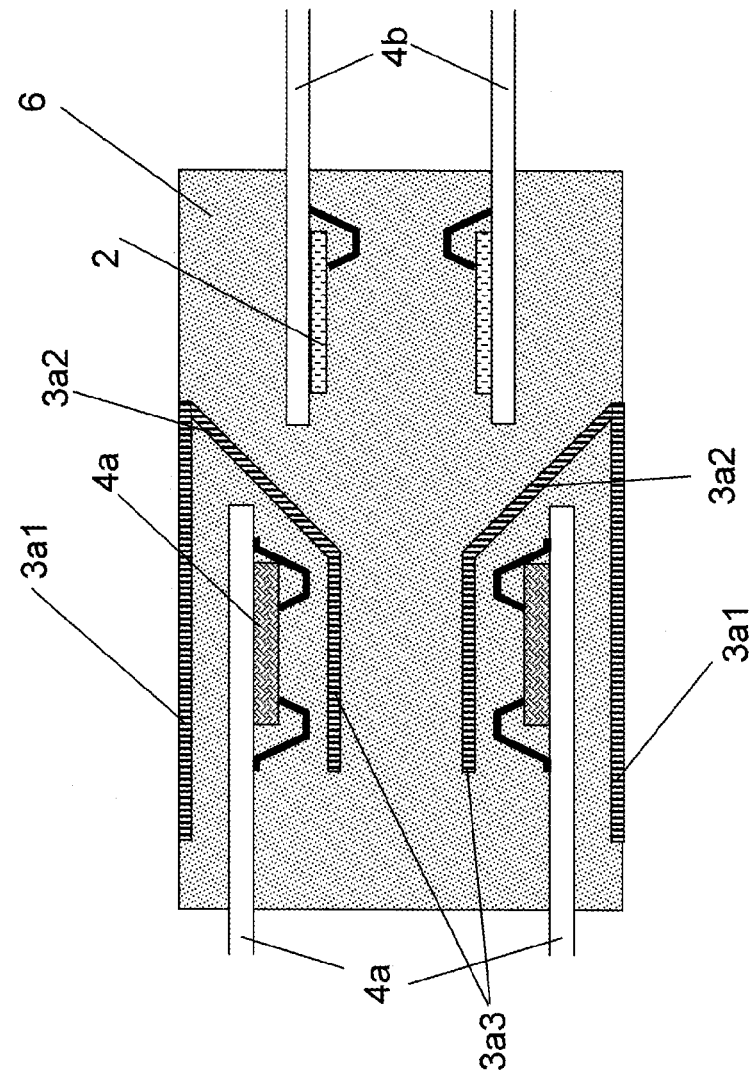
FIG. 14 is a cross-sectional schematic view illustrating a power module in Embodiment 5 of the present invention.

FIG. 14 is a cross-sectional schematic view illustrating a power module to Embodiment 5 of the present invention. The configuration of the power module to Embodiment 5 of the present invention is similar to the configuration that two power module of Embodiment 1 are combined. The power module of Embodiment 5 is different from the power module of Embodiment 1 in a point that the insulation member 8 is not disposed and in a point that the electrical insulation between the plane portion 3a1 and the lead frame 4a is kept by mold resin 6. Other configurations are equivalent to Embodiment 1.

As shown in FIG. 14, two power modules can be combined and laminated by the heat radiating plate 3a of the present invention. A detailed explanation will be described below. In the power module of Embodiment 5, two sets of group of the power semiconductor element 1, the driving element 2, the heat radiating plate 3a, and lead frame 4a, 4b explained in Embodiment 1 is arranged to be laminated. These two sets are held with the mold resin 6, as being in a body. These two sets are laminated to the reverse direction (inversion) in FIG. 14. That is, two sets are laminated so that the plane portion 3a3 of each group faces each other. Since the plane portion 3a1 is exposed to the exterior from the mold resin 6 as compared with the case where these two sets are laminated to the non-reverse direction, it is possible for the heat to get away more efficiently.

In the method of producing the power module, one metal plate which forms the plane portion 3a3, the slope portion 3a2, and the plane part 3a1 is bent like other Embodiments, and the heat radiating plate 3a is produced. Then, the bent heat radiating plate 3a is molded by epoxy mold resin 6 together with the lead frame 4a, 4b on which the power semiconductor element 1 and the driving element 2 are mounted, and the epoxy mold resin is hardened. The one metal plate is made from copper or Al.

In addition, when the two driving elements 2 are not disposed but the one driving element 2 can be communalized, the power semiconductor can be further miniaturized by this communalization.

Moreover, also in Embodiment 5, the configuration in which the insulation member 8 is disposed between the plane portion 3a1 and the lead frame 4a can be used like Embodiment 1.

Moreover, the power module of Embodiments 2, 3, and 4 can be laminated in this way.

Figure 15:
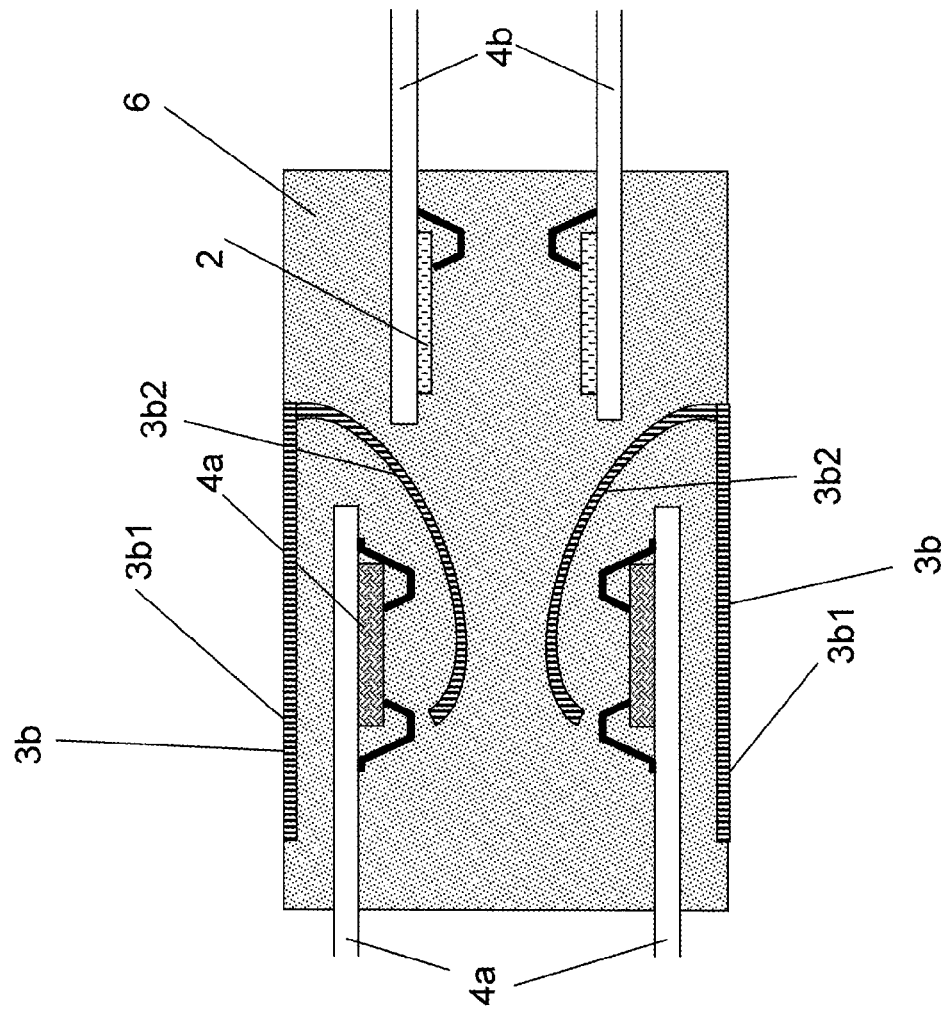
FIG. 15 is a cross-sectional schematic view illustrating a modified example of a power module in Embodiment 5 of the present invention.

FIG. 15 is a cross-sectional view illustrating a power module in which two sets of group of the power semiconductor element 1, the driving element 2, the heat radiating plate 3b, and lead frame 4a, 4b explained in Embodiment 2 are arranged to be laminated and these two sets are held with the mold resin 6, as being in a body. As shown in FIG. 15, the two sets is arranged to be laminated so that the arc-shaped portion of each groups faces each other.

Figure 16:
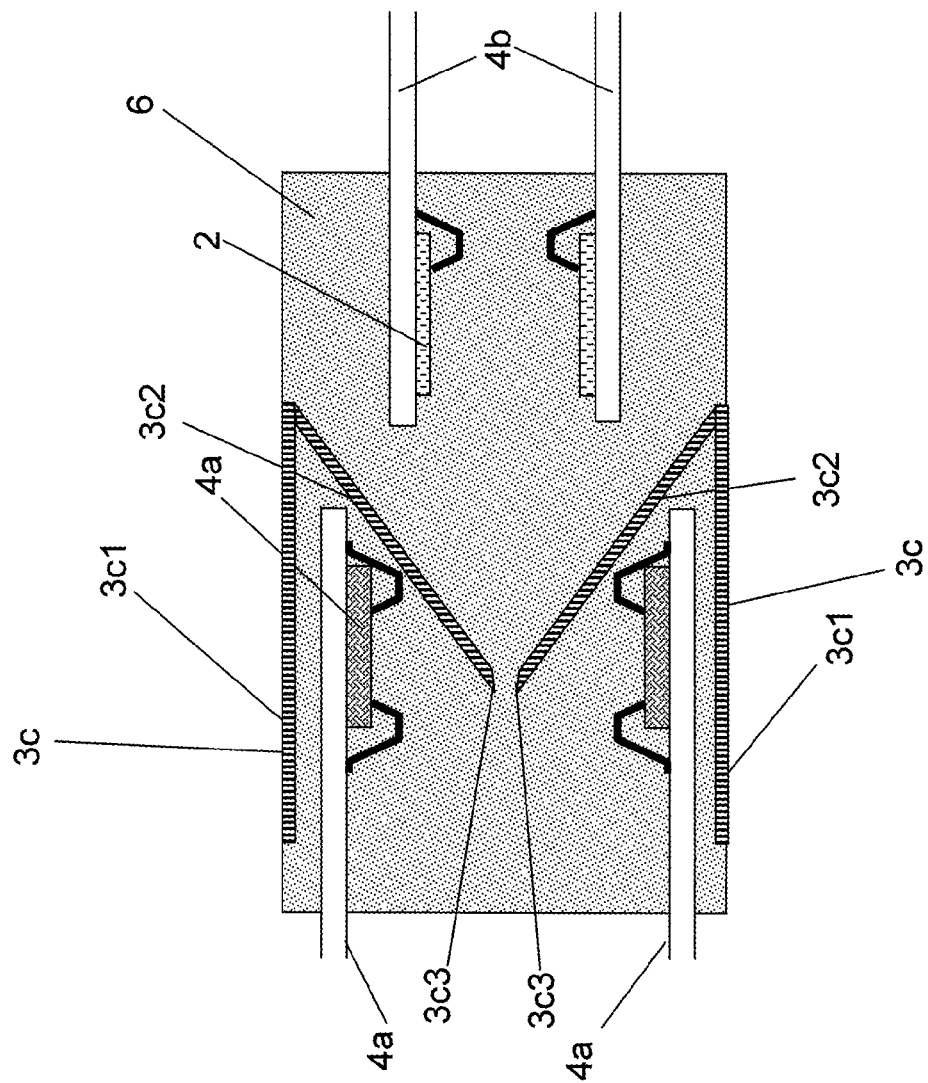
FIG. 16 is a cross-sectional schematic view illustrating a modified example of a power module in Embodiment 5 of the present invention.

FIG. 16 is a cross-sectional view illustrating a power module in which two sets of group of the power semiconductor element 1, the driving element 2, the heat radiating plate 3c, and lead frame 4a, 4b explained in Embodiment 3 are arranged to be laminated and these two sets are held with the mold resin 6, as being in a body. As shown in FIG. 16, the two sets is arranged to be laminated so that the slope portion 3c2 of the heat radiating plate 3c of each groups faces each other.

Moreover, the heat radiating plate 3a of which the plane part 3a3 shown in FIG. 3 curves a little can be used instead of the heat radiating plate 3a used for Embodiment 5.

Embodiment 6

Figure 17:
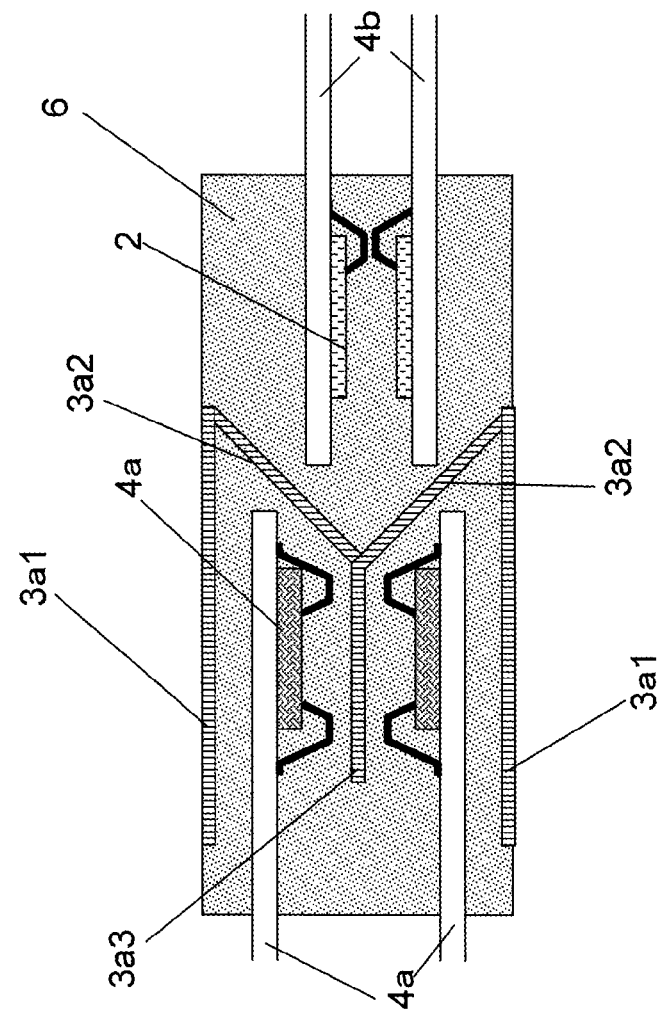
FIG. 17 is a cross-sectional schematic view illustrating a power module in Embodiment 6 of the present invention.
Figure 19:
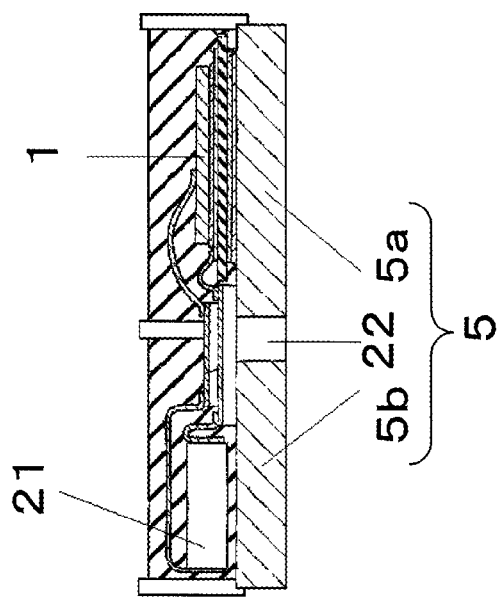
FIG. 19 is a cross-sectional view illustrating a cool structure of a conventional power module.

FIG. 17 is a cross-sectional schematic view illustrating a power module to Embodiment 6 of the present invention. The configuration of the power module to Embodiment 6 of the present invention is similar to the configuration that two power module in Embodiment 1 are combined. The power module of Embodiment 6 is different from the power module of Embodiment 1 in a point that the insulation member 8 is not disposed and in a point that the electrical insulation between the plane portion 3a1 and the lead frame 4a is kept by mold resin 6. Other configurations are similar to Embodiment 1.

A detailed explanation will be described below. In the power module of Embodiment 6, two sets of group of the power semiconductor element 1, the driving element 2, the heat radiating plate 3a, and lead frame 4a, 4b explained in Embodiment 1 is arranged and these two sets are held with the mold resin 6 as being in a body like Embodiment 5. However, the two sets of Embodiment 6 are closer than those of Embodiment 5 (in the case of FIG. 14), and the plane portion 3a3 is communalized in the upper set and the lower set. In other words, the two sets are laminated to face each other so that the plane portion 3a3 is communalized.

For this reason, since slimming down is possible as a whole, and the heat radiating plate 3a can be made to be one continuous body, the distribution of the heat can be made uniform.

In addition, when the two driving elements 2 are not disposed, but the one driving element 2 can be communalized, the power semiconductor can be further miniaturized by this communalization.

Moreover, the power module of Embodiments 2, 3, and 4 can be laminated in this way.

The method of producing the power module of Embodiment 6 will be described as follows. Previously, a metal plate which forms the plane portion 3a3, the slope portion 3a2, and the plane portion 3a1 is welted to a metal plate which forms the plane portion 3a3 and the slope portion 3a2, and the welted metal plate is bent in each part, so that the heat radiating plate 3a is produced. Then, the bent heat radiating plate 3a is molded by epoxy mold resin 6 together with the lead frame 4a, 4b on which the power semiconductor element 1 and the driving element 2 are mounted, and the epoxy mold resin is hardened like other Embodiments, so that the power module is produced.

Moreover, the power module of Embodiments 2, 3, and 4 can be laminated in this way.

For example, in the power module of the composition of FIG. 16, a configuration that tips 3c3 of the slope portions 3c2 of two sets can be connected or contacted each other. The connected two heat radiating plates 3c can be formed by bending one metal plate and can be formed by welting.

In addition, also in Embodiments 4, 5, and 6, the configuration in which the insulation member 8 is disposed between the plane portion 3a1 and the lead frame 4a can be used like Embodiment 1.

INDUSTRIAL APPLICABILITY

The present invention realizes a reliable power module in which a good performance of radiating the heat of the power semiconductor element is secured and it is hard for the heat of a power semiconductor element to be conducted to a driving element and effectively applied to an inverter etc. which are mounted on home electronics in which a miniaturization is demanded, such as an air-conditioner and a cleaner.

REFERENCE SIGNS LIST 1 power semiconductor
2 driving element
3a, 3b, 3c, 30 heat radiating plate
4a, 4b lead frame
5 conventional heat radiating plate
6 mold resin
6a, 6b domain
7 wirebonding connection portion
8 insulation member
21 smoothing capacitor
22 slit
A bending position

What is claimed is:

1. A power module comprising:
a lead frame;
a power semiconductor element mounted on the lead frame;
a driving element mounted on the lead frame;
a heat radiating plate radiating heat which is generated by the power semiconductor element; and
a resin holding the power semiconductor element, the driving element, and the heat radiating plate, wherein
the heat radiating plate has a portion disposed at a side opposite to a surface of the lead frame where the power semiconductor element is mounted, a portion disposed between the power semiconductor element and the driving element, and a portion disposed below the power semiconductor element, as the portions being in a body.

2. The power module according to claim 1, wherein
the heat radiating plate has a first flat portion disposed at the side opposite to the surface of the lead frame where the power semiconductor element is mounted, a second flat portion between the power semiconductor element and the driving element, and a third flat portion disposed below the power semiconductor element.

3. The power module according to claim 2, wherein
an angle that is formed by the first flat portion and the second flat portion is greater than 45 degrees and smaller than 60 degrees.

4. The power module according to claim 2, wherein
the third flat portion is a form of a mesh.

5. The power module according to claim 2, wherein
two sets of group of the lead frame, the power semiconductor element, the driving element, and the heat radiating plate are arranged;
the two sets are held with the resin; and
the two sets are laminated so that the third flat portion of each group faces each other.

6. The power module according to claim 5, wherein
the facing two third flat portions are communalized.

7. The power module according to claim 1, wherein
the heat radiating plate has a first flat portion disposed at the side opposite to the surface of the lead frame where the power semiconductor element is mounted, and a portion whose cross-sectional form is arc-shaped, and which passes along between the power semiconductor element and the driving element and goes below the power semiconductor element.

8. The power module according to claim 7, wherein
two sets of group of the lead frame, the power semiconductor element, the driving element, and the heat radiating plate are arranged;
the two sets are held with the resin; and
the two sets are laminated so that the arc-shaped portion of each group faces each other.

9. The power module according to claim 1, wherein
the heat radiating plate has a first flat portion disposed at the side opposite to the surface of the lead frame where the power semiconductor element is mounted, and a forth flat portion which passes along between the power semiconductor element and the driving element and goes below the power semiconductor element.

10. The power module according to claim 9, wherein
an angle that is formed by the first flat portion and the forth flat portion is greater than 45 degrees and smaller than 60 degrees.

11. The power module according to claim 9, wherein
two sets of group of the lead frame, the power semiconductor element, the driving element, and the heat radiating plate are arranged;
the two sets are held with the resin; and
the two sets are laminated so that the forth flat portion of each group faces each other.

12. The power module according to claim 1, wherein
an end portion, which is disposed below the power semiconductor element, of the heat radiating plate does not touch the lead frame.

* * * * *